United States Patent
Kimura et al.

(10) Patent No.: US 10,453,648 B2
(45) Date of Patent: Oct. 22, 2019

(54) CHARGED PARTICLE BEAN DEVICE AND INFORMATION-PROCESSING DEVICE

(71) Applicant: Hitachi High-Technologies Corporation, Minato-ku, Tokyo (JP)

(72) Inventors: Yoshinobu Kimura, Tokyo (JP); Natsuki Tsuno, Tokyo (JP); Toshihide Agemura, Tokyo (JP); Takeshi Ogashiwa, Tokyo (JP); Junichiro Tomizawa, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 315 days.

(21) Appl. No.: 15/520,953

(22) PCT Filed: Oct. 22, 2015

(86) PCT No.: PCT/JP2015/079761
§ 371 (c)(1),
(2) Date: Apr. 21, 2017

(87) PCT Pub. No.: WO2016/068002
PCT Pub. Date: May 6, 2016

(65) Prior Publication Data
US 2017/0345614 A1 Nov. 30, 2017

(30) Foreign Application Priority Data
Oct. 28, 2014 (JP) .................................. 2014-219493

(51) Int. Cl.
*H01J 37/22* (2006.01)
*H01J 37/06* (2006.01)
(Continued)

(52) U.S. Cl.
CPC ............ *H01J 37/222* (2013.01); *H01J 37/06* (2013.01); *H01J 37/244* (2013.01); *H01J 37/28* (2013.01);
(Continued)

(58) Field of Classification Search
CPC .......... H01J 37/222; H01J 37/22; H01J 37/06; H01J 37/244; H01J 37/26; H01J 37/261;
(Continued)

(56) References Cited

U.S. PATENT DOCUMENTS 4,933,553 A * 6/1990 Tomizawa ............ H01J 37/153
250/307
8,841,612 B2 * 9/2014 Fukuda ................. H01J 37/222
250/306
(Continued)

FOREIGN PATENT DOCUMENTS

JP 1-155251 A 6/1989
JP 3-20947 A 1/1991
(Continued)

OTHER PUBLICATIONS

Japanese-language Office Action issued in counterpart Japanese Application No. 2014-219493 dated Nov. 28, 2017 (7 pages).
(Continued)

*Primary Examiner* — John R Lee
(74) *Attorney, Agent, or Firm* — Crowell & Moring LLP

(57) ABSTRACT

There is provided a charged particle beam apparatus capable of obtaining a high SN ratio with a small electron irradiation amount. The charged particle beam apparatus includes a charged particle detection device. The charged particle detection device detects an analog pulse waveform signal (110) in a detection of emitted electrons (1 event) when one primary electron enters a sample, converts the analog pulse waveform signal (110) into a digital signal (111), perform a
(Continued)

wave height discrimination (112) with the use of a unit peak corresponding electron, and outputs the digital signal (111) as a multilevel count value.

15 Claims, 11 Drawing Sheets

(51) Int. Cl.
*H01J 37/244* (2006.01)
*H01J 37/28* (2006.01)
(52) U.S. Cl.
CPC .............. *H01J 2237/2443* (2013.01); *H01J 2237/2448* (2013.01); *H01J 2237/24495* (2013.01); *H01J 2237/24507* (2013.01)
(58) Field of Classification Search
CPC .. H01J 37/256; H01J 37/28; H01J 2237/2443; H01J 2237/2448; H01J 2237/24495; H01J 2237/245; H01J 2237/24507
See application file for complete search history.

(56) References Cited

U.S. PATENT DOCUMENTS

| | | | |
|---|---|---|---|
| 9,236,220 B2 * | 1/2016 | Tsuno | H01J 37/244 |
| 10,121,634 B2 * | 11/2018 | Tsuno | H01J 37/28 |
| 2005/0253069 A1 * | 11/2005 | Zewail | H01J 37/065 |
| | | | 250/311 |
| 2007/0263223 A1 * | 11/2007 | Hirai | H01J 37/244 |
| | | | 356/450 |
| 2014/0097342 A1 * | 4/2014 | Tsuno | H01J 37/28 |
| | | | 250/307 |
| 2016/0225583 A1 * | 8/2016 | Tsuno | H01J 37/28 |
| 2017/0345614 A1 * | 11/2017 | Kimura | H01J 37/244 |
| 2019/0122856 A1 * | 4/2019 | Morita | H01J 37/3007 |

FOREIGN PATENT DOCUMENTS

| | | |
|---|---|---|
| JP | 7-245076 A | 9/1995 |
| JP | 2011-175811 A | 9/2011 |

OTHER PUBLICATIONS

International Search Report (PCT/ISA/210) issued in PCT Application No. PCT/JP2015/079761 dated Nov. 17, 2015 with English-language translation (two (2) pages).
Japanese-language Written Opinion (PCT/ISA/237) issued in PCT Application No. PCT/JP2015/079761 dated Nov. 17, 2015 (three (3) pages).

* cited by examiner

FIG. 2
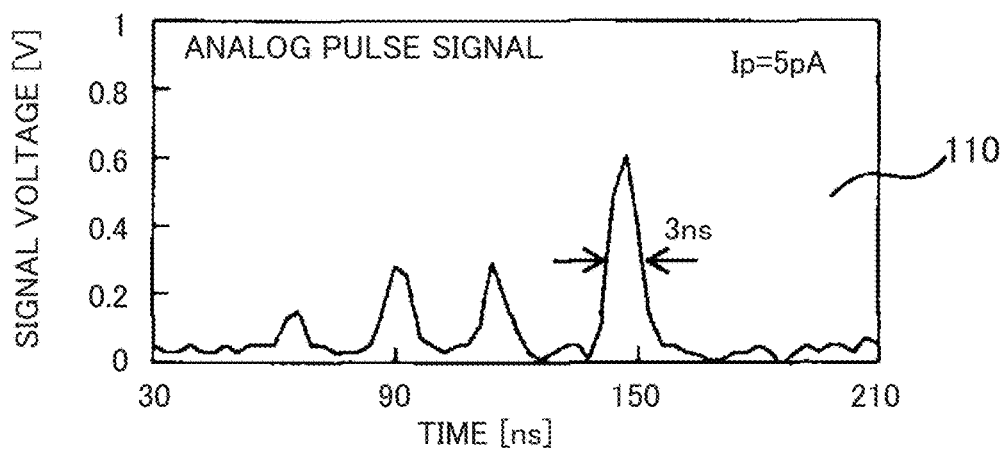
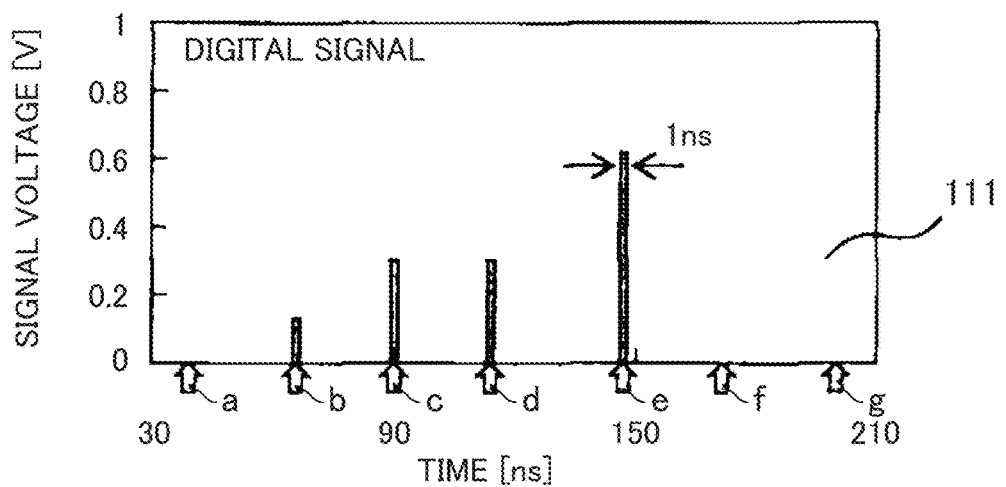
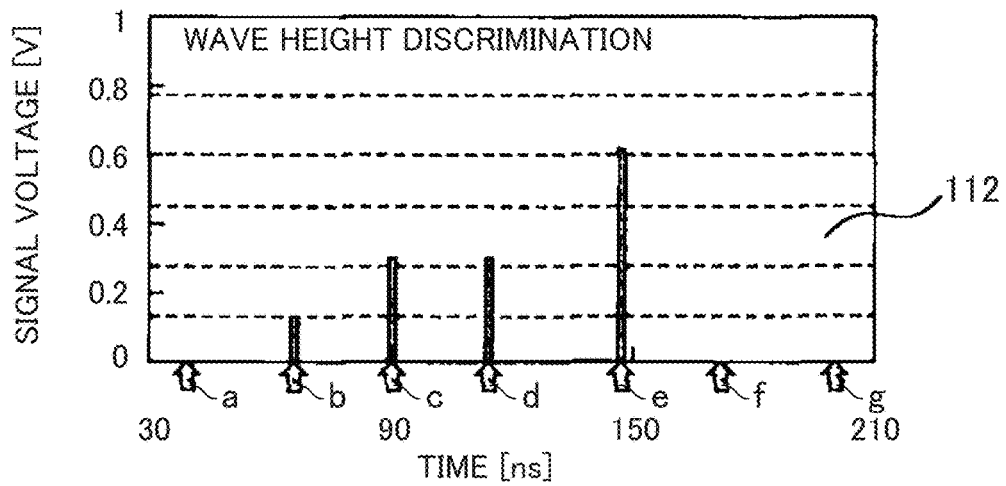

FIG. 3

COUNTER
| a | b | c | d | e | f | g |
|---|---|---|---|---|---|---|
| 0 | 1 | 2 | 2 | 4 | 0 | 0 |

— 113

SIGNAL PROCESSING
| a | b | c | d | e | f | g |
|---|---|---|---|---|---|---|
| 0 | 0 | 2 | 2 | 4 | 0 | 0 |

— 114

SIGNAL PROCESSING
| a | b | c | d | e | f | g |
|---|---|---|---|---|---|---|
| 0 | 1 | 0 | 0 | 0 | 0 | 0 |

— 115

FIG. 6
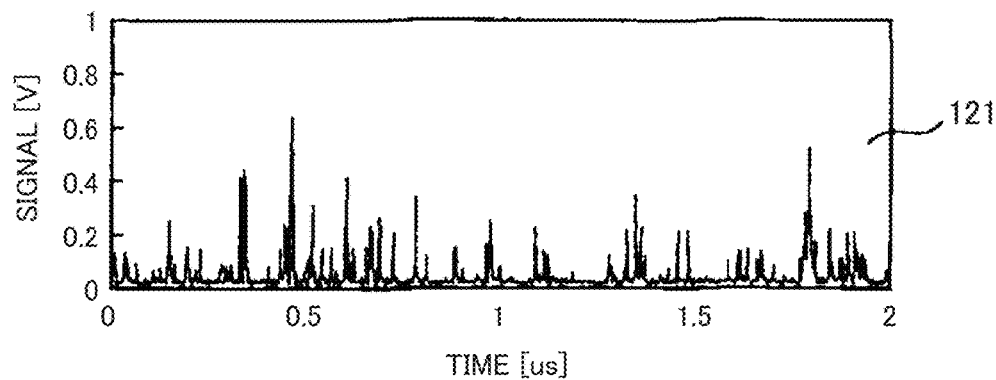
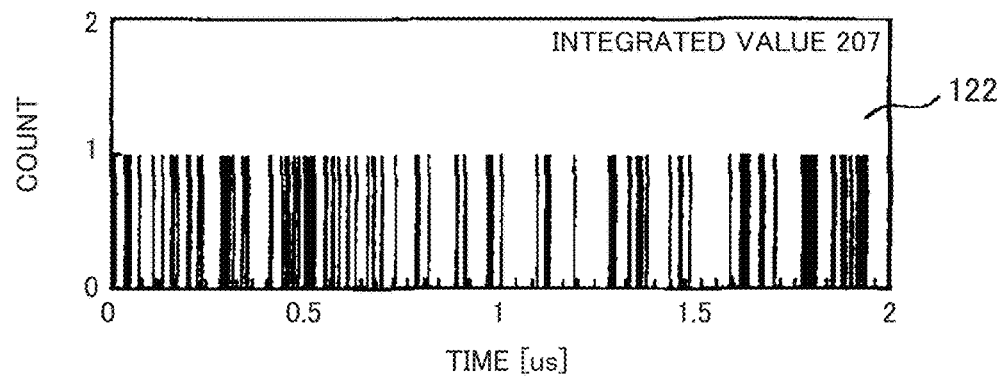
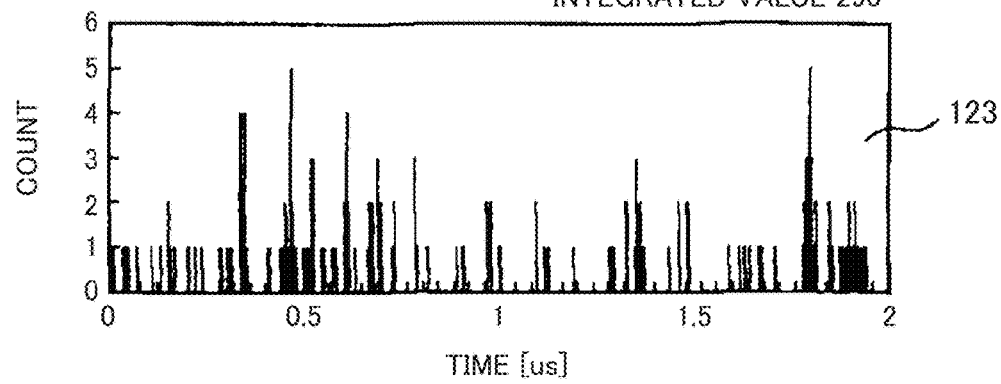

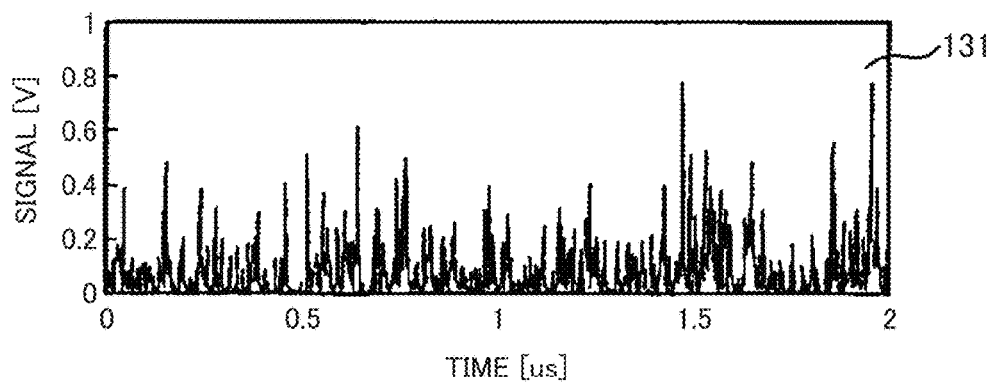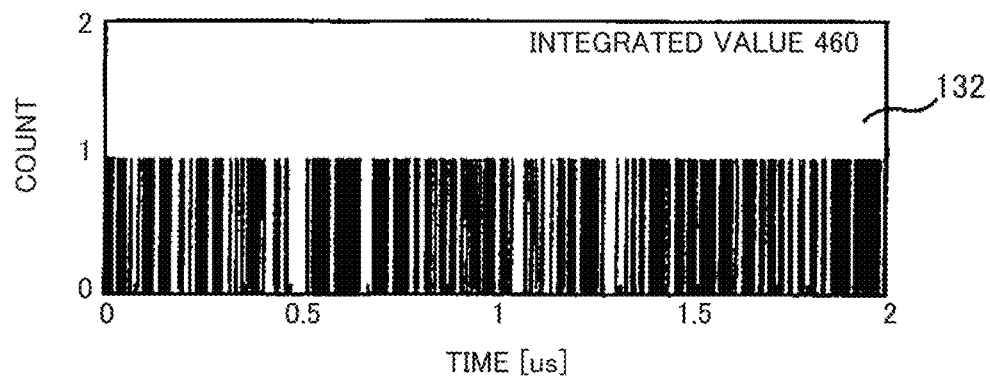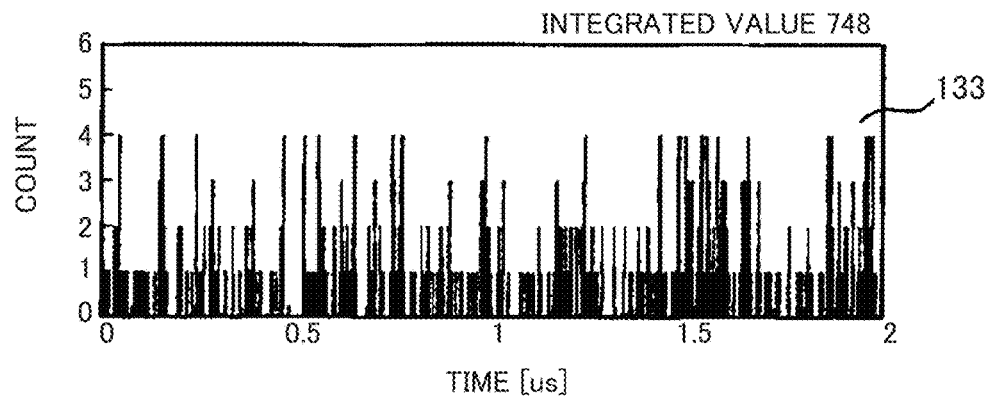
FIG. 7

CHARGED PARTICLE BEAN DEVICE AND INFORMATION-PROCESSING DEVICE

TECHNICAL FIELD

The present invention relates to a charged particle beam apparatus and an information processing apparatus for processing detected information of charged particles.

BACKGROUND ART

A charged particle beam apparatus such as a scanning electron microscope (hereinafter abbreviated as SEM (Scanning Electron Microscope)) or an ion microscope detects electrons emitted from a sample when irradiated with a charged particle beam such as an electron beam or an ion beam.

In particular, the scanning electron microscope for scanning an electron beam on a sample to capture an image is used for sample analysis such as observation of a fine surface shape or local composition analysis. In the SEM, an electron beam (hereinafter referred to as primary electrons) accelerated by a voltage applied to an electron source is focused by an electron lens and the sample is irradiated with the electron beam. The focused electron beam is scanned over the sample by a deflector. The emitted electrons (secondary electrons, reflected electrons) from the sample by electron beam irradiation are detected by a detector. Further, a detection signal of the emitted electrons detected by the detector is sampled at a fixed cycle. The sampling of the signals of the emitted electrons is implemented in synchronization with a scanning signal to obtain an extracted signal corresponding to each pixel of a two-dimensional image.

An intensity of the extracted signal is converted into a brightness of the image. Because an emission rate (also called yield) which is a ratio of the amount of emitted electrons from the sample to the amount of irradiated electrons varies depending on a shape of a sample surface, a difference occurs in the extracted signal to obtain a contrast reflecting the shape. In addition, the emission rate also depends on a composition and a surface potential of the sample. Hence, various contrasts other than the shape appear in the SEM image.

An identification limit $d_{min}$ corresponding to a spatial resolution of an SEM image has the following relationship with a beam diameter (diameter) $d_p$ of a primary electron beam.

[Ex. 1]

$$d_{min} = k \cdot d_p \quad (1)$$

where

[Ex. 2]

$$k = \sqrt{-\ln\left(1 - \frac{CNR}{2\sqrt{N_p \cdot \alpha} \cdot \left(\sqrt{\sigma_p} - \sqrt{\sigma_s}\right)}\right)} \quad (2)$$

In this example, CNR (Contrast-to-Noise Ratio) is a contrast-to-noise ratio, and empirically requires 3 to 5. N is the irradiation (dose) amount of primary electrons per pixel, α is a signal detection efficiency of emitted electrons from the sample to the detector, $\sigma_p$ is an emission rate of an object to be measured, and $\sigma_s$ is an emission rate of a foundation.

Therefore, if a dose amount and an emission rate difference between the object to be measured and the foundation are large as compared with a beam diameter of the given primary electron beam, k becomes small and the identification limit becomes high. Hence, in the SEM, it is important to measure the amount of emitted electrons with high accuracy.

In recent years, there have been increasing cases where samples including soft materials such as organic materials or biomaterials, semiconductor devices, and so on are to be observed by the SEM. The semiconductor device contains an electrically high resistance and insulating material and the sample is charged by the electronic beam irradiation. This leads to a problem with image defects such as an image drift during observation and disappearance of a shape contrast. In addition, in the organic material, the sample is damaged by the electron beam irradiation in addition to charging, and a change in the shape of the sample becomes problematic. As a result, a low acceleration SEM with an acceleration voltage of 1 kV or less has been put to practical use. Furthermore, in many substances, when irradiation energy of the electron beam is around 200 eV to 400 eV, the emission rate becomes a maximum value. Therefore, if an aberration of the primary electron beam can be reduced and the beam diameter can be reduced, a spatial resolution is also improved. However, when an observation area is narrowed in high magnification observation, a pixel size is reduced and the amount of electrons irradiated per pixel is increased. Therefore, even in the low acceleration SEM, there is a problem that influence of charging and damage by the electron beam irradiation becomes obvious. Therefore, observation with lower energy of the primary electron beam and a reduced electron irradiation amount per pixel is required, and highly accurate detection of emitted electrons becomes increasingly important.

In the SEM, a detector combining a scintillator and a photomultiplier tube together is used to detect the emitted electrons. When the emitted electrons collide with the scintillator, photons are generated, and the photons are guided to the photomultiplier tube by a light guide and taken out as a signal current. The signal current is converted into a signal voltage by an amplifier. When an emitted electron current decreases, an output from the photomultiplier becomes a discrete pulse, as a result of which an S/N ratio (signal-to-noise ratio) and stability are improved through the counting process. An SEM image acquiring method by the electronic counting method is disclosed in Patent Literature 1. On the other hand, when a plurality of electrons enter within a response time of the detector, those electrons may be determined as one piece in the electronic counting method. In other words, when the number of emitted electron currents increases, there are cases where the counting method may cause an undercount. For that reason, in the disclosure of Patent Literature 2, when the electrons enter within the response time of the detector, the detection is performed by an analog method.

CITATION LIST

Patent Literature

Patent Literature 1: Japanese Unexamined Patent Application Publication No. Hei 3-20947

Patent Literature 2: Japanese Unexamined Patent Application Publication No. 2011-175811

SUMMARY OF INVENTION

Technical Problem

According to the method of shunting to the electronic counting method and the analog method according to the amount of emitted signals, a method of calculating a signal intensity in each of the electronic counting method and the analog method is different, and in the analog method, a variation in the number of photons from the scintillator and a dark current noise of a photomultiplier tube are included. Hence, because the extracted signals different in standard are mixed together in the image, it is complicated to continuously convert the signal intensities in the electronic count method and the analog method and to perform a correspondence between the amount of emitted electrons and the pixel brightness signal.

In the electronic counting method, it is determined whether one electron is present or not. However, since the emission rate becomes larger than 1 under a low acceleration condition, even if the primary electron current is minute, a plurality of secondary electron numbers may be emitted by one primary electron, and an electron generation time difference is equal to or less than one picosecond. On the other hand, a response speed of the detector is limited by an afterglow time (about several nanoseconds) of the scintillator. For that reason, a plurality of emitted secondary electrons are determined to be one, as a result of which a signal amount is measured to be smaller. In the electronic counting method, because the emission signal is calculated from a frequency per unit time (for example, pixel time), there is a problem that a dynamic range of the image is lowered under a low acceleration condition.

Therefore, the present invention provides a charged particle beam apparatus and an information processing apparatus capable of obtaining a high SN ratio with a small electron irradiation amount.

Solution to Problem

The present inventors have found that a multilevel electronic counting process can be performed on the detection information of the charged particles (for example, electrons) caused by a sample irradiated with a charged particle beam. The details of the multilevel electronic counting process will be described in embodiments. The multilevel electronic counting process is performed by pulse height discrimination, thereby being capable of measuring a signal amount high in precision as compared with the conventional electronic counting method.

For example, in order to solve the above problems, configurations defined in the claims are employed. The present invention includes a plurality of solutions for solving the above problem, and as one example of those solutions, there is provided a charged particle beam apparatus including: a stage on which a sample is placed; a charged particle beam optical system that irradiates the sample with a charged particle beam; and a charged particle detection device that detects charged particles secondarily generated from the sample, in which the charged particle detection device includes: a photoelectric conversion unit that converts the charged particles from the sample into photons and converts the photons into an analog electric signal, an analog-to-digital conversion unit that converts the analog electrical signal into a digital signal, and an arithmetic unit that counts the digital signal. The calculation unit multi-values a signal per unit time in the digital signal with the use of a unit peak value related to one event generated when the sample is irradiated with one charged particle and outputs the multi-valued signal as a multilevel count value.

Also, according to another example, there is provided an information processing apparatus including: an input unit that inputs detection information obtained by detecting the charged particles caused by the sample irradiated with the charged particle beam as a current value or a voltage value; and a determination unit that makes first determination of dividing the detection information into a first state, a second state, and a third state based on arbitrary first and second threshold values determined by a current value or a voltage value.

Advantageous Effects of Invention

According to the present invention, a high SN ratio can be obtained with a small amount of electron irradiation.

Further features relating to the present invention will become apparent from a description of the present specification and the accompanying drawings. In addition, the problems, configurations, and advantageous effects other than those mentioned above will be clarified by the description of the following embodiments.

BRIEF DESCRIPTION OF DRAWINGS

FIG. 2 is a diagram illustrating a multilevel electronic counting method according to the first embodiment.

FIG. 3 is a diagram illustrating information that has been processed in an electronic counter according to the first embodiment and information that has been processed by an arithmetic processing unit.

FIG. 6 is a diagram illustrating a signal of the flat portion, which is an example of the measurement result.

FIG. 7 is a diagram illustrating a signal of the edge portion, which is an example of the measurement result.

DESCRIPTION OF EMBODIMENTS

Figure 1:
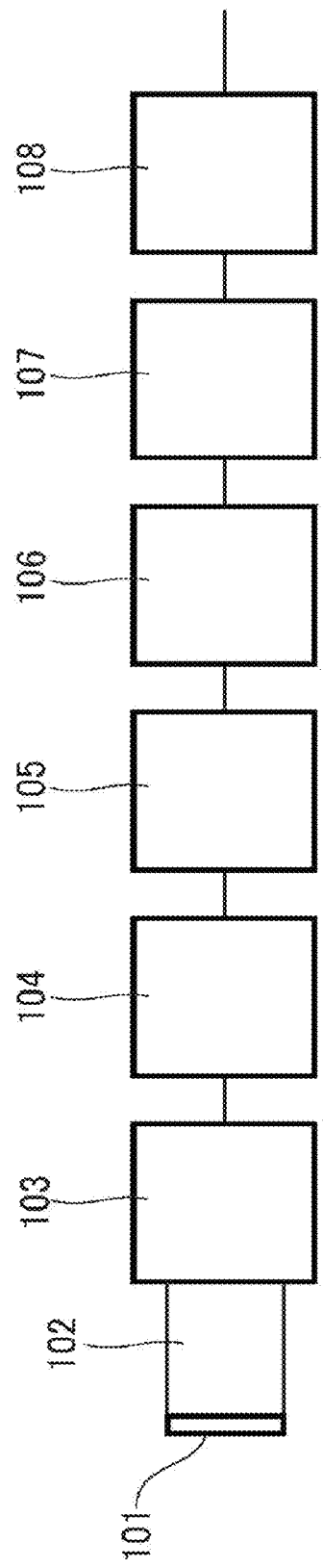
FIG. 1 is a configuration diagram illustrating an example of a charged particle detection device according to a first embodiment.

Hereinafter, embodiments of the present invention will be described with reference to the accompanying drawings. The accompanying drawings illustrate specific embodiments according to a principle of the present invention, but those drawings are intended for understanding the present invention, and are not used to interpret the present invention in a limiting manner. The same reference numerals are assigned to common configurations in the respective drawings.

The embodiments described below relates to a technique of a charged particle detection device for detecting charged particles and a charged particle beam apparatus for observing a sample with the use of a charged particle beam, and more particularly to a method of detecting emitted electrons and a signal processing technique in those device and apparatus.

First Embodiment

FIG. 1 is a schematic configuration diagram of a charged particle detection device according to a first embodiment. The charged particle detection device is a device for detecting charged particles secondarily generated from a sample when the sample is irradiated with primary charged particles. The charged particle detection device includes a scintillator 101, a light guide 102, a photomultiplier tube 103, an analog amplifier 104, an analog-to-digital converter (AD converter) 105, a wave height discrimination unit 106, an electronic counter 107 and an arithmetic processing unit 108.

The scintillator 101 converts charged particles (for example, electrons) into photons, and the light guide 102 guides the photons from the scintillator 101 to the photomultiplier tube 103. The photomultiplier tube 103 internally multiplies the photons, converts the multiplied photons into an electric signal, and outputs the converted electric signal as an output current to the analog amplifier 104. The analog amplifier (current-voltage conversion amplifier) 104 is an amplification unit that converts a current signal of the photomultiplier tube 103 into a voltage signal. In the following description, the components of the scintillator 101, the light guide 102, the photomultiplier tube 103, and the analog amplifier 104 may be collectively referred to as a photoelectric conversion unit. The analog-to-digital converter 105 converts an analog signal from an analog amplifier 104 into a digital signal.

The wave height discrimination unit 106 outputs a discrimination value (hereinafter referred to as a unit peak value) with respect to the digital signal output from the analog-to-digital converter 105. The electronic counter 107 outputs a frequency of the unit peak value per unit time (hereinafter referred to as multilevel count value) in the digital signal with the use of the unit peak value output from the wave height discrimination unit 106. The arithmetic processing unit 108 executes a predetermined arithmetic process on the multilevel count value output from the electronic counter 107. In the following description, the components of the wave height discrimination unit 106, the electronic counter 107, and the arithmetic processing unit 108 may be collectively referred to as an arithmetic unit.

In the present embodiment, a description will be given by taking as an example the measurement of a current emitted from the sample irradiated with a primary electron beam having a current of 5 pA. Although sample incident energy of the primary electrons may be arbitrary but is preferably 200 eV to 400 eV, which maximizes an emission rate of all emitted electrons (a sum of secondary electrons and reflected electrons).

In addition, in this example, the detection of emitted electrons when one primary electron enters the sample is called one event. In other words, one event may have four processes of (1) only the reflected electrons are detected, (2) only secondary electrons are detected, (3) reflected electrons and secondary electrons are detected, and (4) neither the secondary electrons nor the reflected electrons are detected.

It is assumed that electrons are not bunched because the electrons are Fermi particles. Electron emission from an electron source is a Poisson process and electron spacings are not constant. It is assumed that the spacing of one event is $\Delta t_1$. When it is assumed that an average electron spacing is $\tau$, the spacing is expressed by the following Expression.

[Ex. 3]

$$\tau = \lim_{N \to \infty} \frac{\sum_{i=1}^{N} \Delta t_i}{N-1} = \frac{e}{I_p} \quad (3)$$

In this example, $e=1.6*10^{-19}$ coulombs. Therefore, with an irradiation current of 5 pA, the following Expression is met.

[Ex. 4]

$$\tau = \frac{1.6 \times 10^{-19}}{5 \times 10^{-12}} = 32 \times 10^{-9} = 32 \, \text{ns} \quad (4)$$

It is assumed that a variation in the electron spacings of an emission current is about the same as the electron spacing variation of the irradiation current and the variation of the electron spacing is measured at intervals of 1/10 of $\tau$. A response speed of the scintillator 101 used in the present embodiment is 3 ns or less. In addition, a rise time of the photomultiplier 103 is 0.6 ns, an electron transit time is 3 ns, and an electron transit time fluctuation is 0.2 ns. A band of an analog amplifier (current-voltage conversion amplifier) 104 may be at least 313 MHz, and 350 MHz (gain is 60 dB) is used.

FIG. 2 is a diagram illustrating a multilevel electronic counting method according to the present embodiment, which illustrates an analog pulse waveform signal, a digital signal after digital conversion, and a digital signal illustrating a counting process by wave height discrimination. According to the configuration of the scintillator 101, the light guide 102, the photomultiplier tube 103, and the analog amplifier 104, an output of the current-voltage amplifier of the emission, current (in other words, the signal that has been processed in the analog amplifier 104) can be measured as an isolated analog pulse waveform signal for one event.

Next, the analog-to-digital converter 105 converts the analog pulse waveform signal from the analog amplifier 104 into a digital signal. As a result, a variation in the number of photons from the scintillator 101 and dark current noise in the photomultiplier tube 103 are removed. In FIG. 2, reference numeral 111 denotes a digital signal that has been subjected to conversion processing by the analog-to-digital converter 105, and symbols a to g in the digital signal 111 indicate 32 ns spacings as described above. In this example, the analog-to-digital converter 105 may have a resolution of 6 bits and a conversion rate of 700 Msps (sps: samples per second), and in the present embodiment, 1 Gsps is used.

From the above viewpoint, in the configuration of the present embodiment, when it is assumed that the current of the electron beam (charged particle beam) is I and an elementary charge is e, it is desirable that a frequency band f of the analog amplifier 104 is $10 \times I_p/e$ or more, and a sampling frequency $f_2$ of the analog-to-digital converter 105 is $2 \times f_1$ or more.

Next, the wave height discrimination unit 106 outputs a value (unit wave height value) for discrimination with respect to the digital signal of one event output from the analog-digital converter 105. In this example, the present inventors have found out from the wave height measurement that the wave height is discrete and the unit height is equivalent to one electron. In the present embodiment, it is assumed that the unit wave height is 0.15 V, and as described later, an upper limit of the number of emitted electrons is 15. Therefore, a quantization error $\Delta V$ of the resolution of 6 bits is 2.25 (=0.15×15)/64=0.035 V, which is sufficient to discriminate the unit wave height. In FIG. 2, reference numeral 112 is a diagram of the digital signal output from the analog-to-digital converter 105 with a width (0.15 V width) of the unit peak value indicated by dotted lines. Although the unit wave height value is described as an example of 0.15 V, the unit wave height value is not limited to this value and may be set as appropriate according to a performance of the analog amplifier 104 and the like.

The wave height discrimination unit 106 outputs the unit peak value for one event and the electronic counter 107 calculates a frequency of the unit wave height value for the signal per unit time in the digital signal with the use of the unit peak value output from the wave height discrimination unit 106 and outputs the frequency as a multilevel count value. For example, referring to an example of the digital signal 112 in FIG. 2, the electronic counter 107 outputs a frequency "0" for a, a frequency "1" for b, and outputs a frequency "2" for c or the like, thereby executing the multilevel counting process.

FIG. 3 illustrates information that has been subjected to the counting process by the electronic counter 107 and the information that has been subjected to the arithmetic processing by the arithmetic processing unit 108. Reference numeral 113 in FIG. 3 denotes information on the multilevel count value that has been subjected to the counting process by the electronic counter 107. Symbols a to g of the signal 113 in FIG. 3 correspond to symbols a to g of the signal 112 in FIG. 2. When the frequency for each pulse of the digital signal 112 in FIG. 2 is calculated for each dotted line, the frequency becomes a multilevel count value in the signal 113 of FIG. 3.

The data of the multilevel count value outputted from the electronic counter 107 is processed by an arithmetic processing unit (arithmetic processing circuit) 108 configured by an FPGA (Field Programmable Gate Array). Although to be described in detail later, for example, the arithmetic processing unit 108 discriminates data of multilevel count values of the signal 113 with the use of a predetermined threshold value. Reference numerals 114 and 115 in FIG. 3 are results discriminated with the use of threshold values. Reference numeral 114 is data of the multilevel count value obtained by extracting only the values of 2 or more in the signal 113. On the other hand, reference numeral 115 is data of the multilevel count value obtained by extracting only the value of 0 or 1 in the signal 113.

It should be noted that the arithmetic processing unit 108 may execute other arithmetic processing on the data of the multilevel count value output from the electronic counter 107. For example, the electronic counter 107 may execute integration processing or statistical processing such as average or dispersion (or standard deviation) on the data of the multilevel count value output from the electronic counter 107 and output the result as detection signal.

Figure 4:
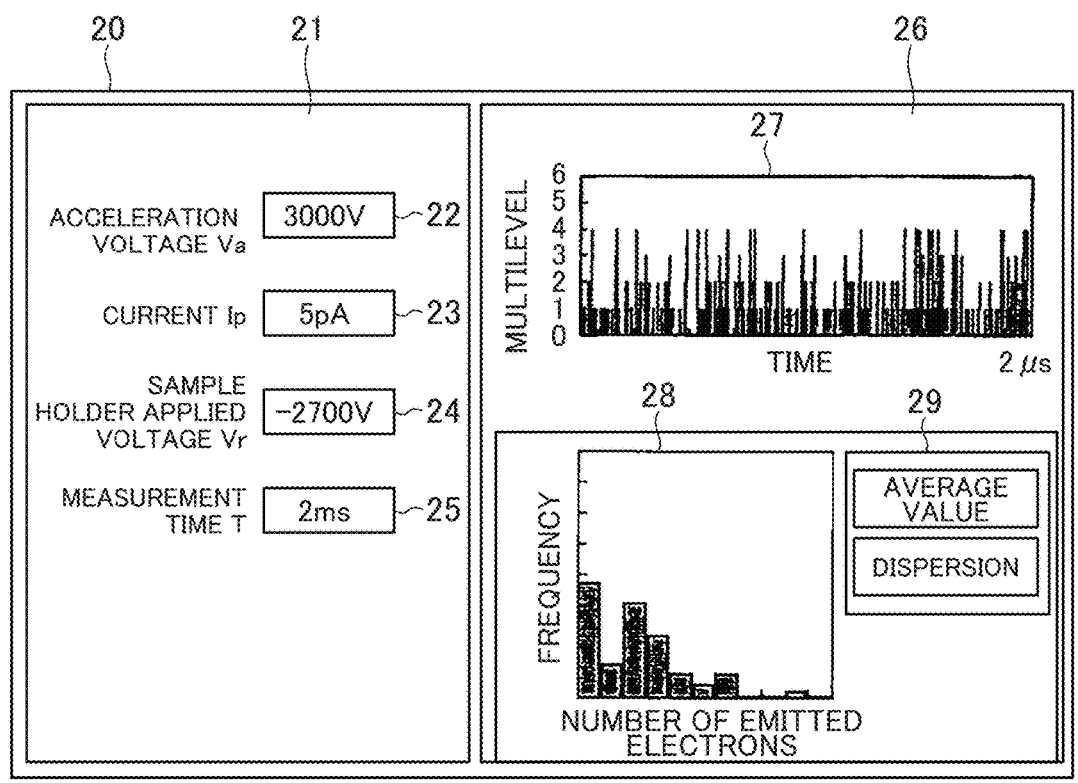
FIG. 4 is a diagram illustrating an example of a GUI.

FIG. 4 illustrates an example of a GUI (Graphical User Interface) for counting measurement. The GUI 20 displayed on an operation interface 17 includes a measurement condition input unit 21 and a measurement result display unit 26.

The measurement condition input unit 21 includes an acceleration voltage setting unit 22, a primary electron current setting unit 23, a sample holder applied voltage setting unit 24, and a measurement time setting unit 25. A user can enter various setting parameters in the measurement condition input unit 21.

The measurement result display unit 26 includes a time-series measurement data display unit 27 for emitted electrons, a first statistical processing result display unit 28, and a second statistical processing result display unit 29. For example, on the time-series measurement data display, (1) an analog signal, (2) a digital signal subjected to AD conversion, (3) data of the multilevel count value outputted from the electronic counter 107, and the like may be displayed with the axis of abscissa as time. In an example of FIG. 4, on the time-series measurement data display unit 27, the data of the multilevel count value outputted from the electronic counter 107 is displayed with the horizontal axis as time.

A histogram of the frequency of emitted electrons is displayed on the first statistical processing result display section 28. Various data such as average and dispersion is displayed on the second statistical processing result display section 29. In this way, the data of the multilevel count value output from the electronic counter 107 and the result of the statistical processing may be displayed side by side.

Figure 5:
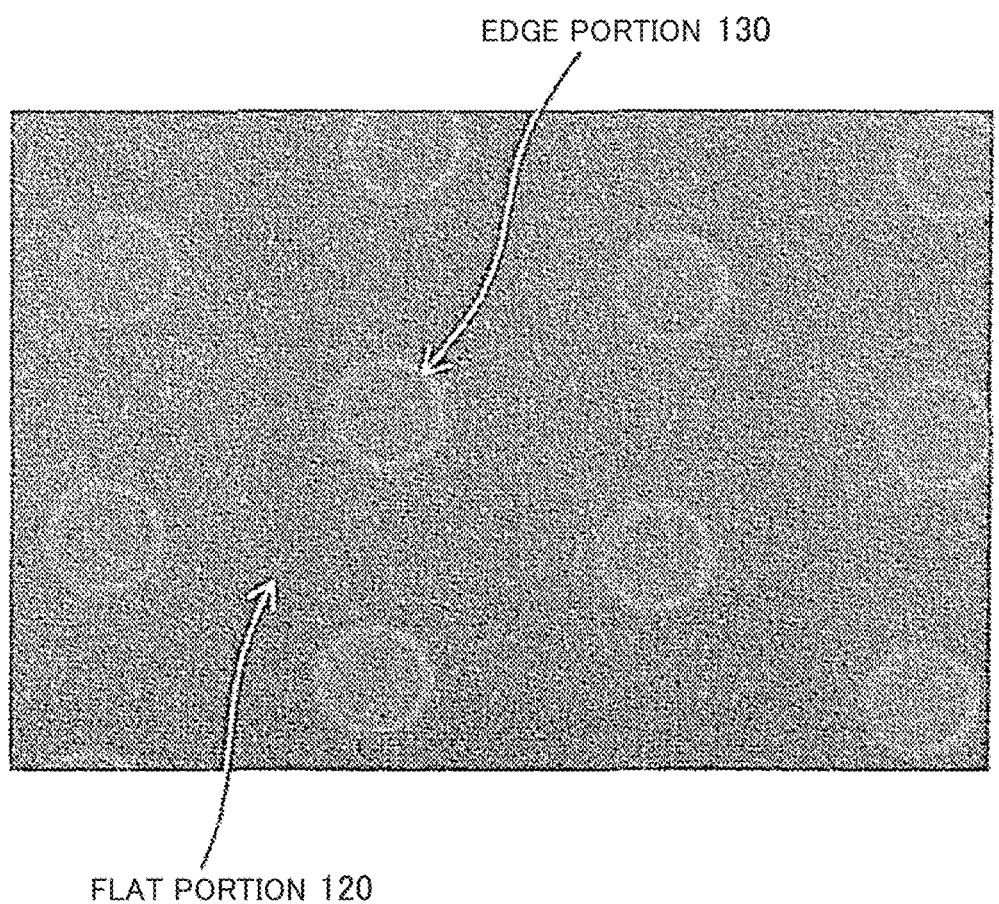
FIG. 5 is a diagram illustrating a flat portion and an edge portion, which is an example of a measurement result.

An example of the measurement result will be described with reference to FIGS. 5, 6 and 7. FIG. 5 illustrates the result of measuring the sample in which cylindrical holes (holes) are patterned. In this example, edge portions 130 of the holes and a flat portion 120 are irradiated with primary electrons and the emitted electrons were measured.

FIG. 6 illustrates a result of measuring the emitted electrons by irradiating the flat portion 120 of FIG. 5 with the primary electrons. Reference numeral 121 denotes a detected analog signal (in other words, the analog signal that has been subjected to the processing in the analog amplifier 104) with the axis of abscissa as time. Reference numeral 122 denotes a result of converting the analog signal of 121 into a digital signal and executing a conventional binary counting process. Reference numeral 123 denotes a result of converting the analog signal of 121 into a digital signal and executing the multilevel counting process of the present embodiment.

As illustrated in FIG. 6, an integrated value of the result 122 of the conventional binary counting process is indicated by reference numeral 207, and an integrated value of the result 123 of the multilevel counting process in the present embodiment is indicated by reference numeral 290. Therefore, in the multilevel counting process, a signal amount is about 40% higher than the conventional binary counting process.

FIG. 7 illustrates a result of measuring the emitted electrons by irradiating the edge portions 130 of FIG. 5 with the primary electrons. Reference numeral 131 denotes a detected analog signal (in other words, the analog signal that has been subjected to the processing in the analog amplifier 104) with the axis of abscissa as time. Reference numeral 132 denotes a result of converting the analog signal of 131 into a digital signal and executing the conventional binary counting process. Reference numeral 133 denotes a result of converting the analog signal of 131 into a digital signal and executing the multilevel counting process of the present embodiment. In addition, in the multilevel counting process of the edge portions in FIG. 7, a signal amount is about 60% higher than the conventional binary counting process.

In the results 123 and 133 of the multilevel counting process, a maximum value of the event is about 4 to 5. When the result 123 of the multilevel counting process in the flat portion of FIG. 6 is compared with the result 133 of the multilevel counting process in the edge portions of FIG. 7, the frequency of two or more emitted electrons increases in one event.

In the conventional binary counting process, the integrated value of the flat portion is "207" whereas the integrated value of the edge portions is "460". On the other hand, in the multilevel counting process of the present embodiment, the integrated value of the flat portion is "290" whereas the integrated value of the edge portions is "748." Therefore, a contrast of the edge portions against the flat portion is improved by about 18% with the execution of the multilevel counting process.

For reference, an experimental value of the gradient effect of the secondary electron emission is 5 times or less at a maximum as compared with the flat case, and assuming that the emission rate in the case of flatness is 3 at a maximum, an upper limit value of the output voltage is estimated as 0.15×15=2.25 V. With the setting of the upper limit value, noise when cosmic rays such as muons enter the detector can be removed.

Meanwhile, the electronic counter 107 may execute both of the multilevel counting processing and the conventional binary counting process. In that case, the electronic counter 107 may output the multilevel counting process result (123 in FIG. 6 or 133 in FIG. 7) and the result of binary counting process result (122 in FIG. 6 and 132 in FIG. 7). The arithmetic processing unit 108 may compare the multilevel counting process result (for example, integrated value) with the binary counting process result (for example, integrated value), and notify the operation interface 17 of the comparison result if a deviation is large (when a difference of integrated values exceeds a predetermined threshold value).

As described above, according to the present embodiment, counting with high precision can be performed even when a plurality of charged particles can exist in one event. As a result, both of the signal amount and the contrast are improved as compared with the conventional method.

In addition, according to the present embodiment, the emitted electrons can be detected with high accuracy, signal dropout and unnecessary signal detection can be suppressed, and detection sampling and detection level can be controlled.

Further, according to the present, embodiment, in the method of measuring the charged particle beam, the signals can be detected with higher accuracy while influence of noise which becomes a problem with a minute detection signal is reduced.

Although the present embodiment has been described as an example of a charged particle detection device, the present invention is not limited to this configuration. The present invention may be implemented as an information processing apparatus for processing detection information obtained by detecting charged particles caused by a sample irradiated with a charged particle beam. The information processing apparatus includes an input unit that inputs the detection information when detecting the charged particles caused by the sample irradiated with the charged particle beam. In this example, the detection information may be a current value or a voltage value obtained when detecting the charged particles to be detected.

The information processing apparatus includes a determination unit that performs first determination for dividing the detection information into a first state, a second state, and a third state based on arbitrary first and second threshold values determined by a current value or a voltage value. The determination unit executes processing corresponding to the pulse height discrimination unit 106, the electronic counter 107, and the arithmetic processing unit 108. The first threshold value and the second threshold value may be threshold values that can discriminate the detection information into the above three states. As an example, the second threshold value is larger than the first threshold value.

As an example of the result of determination based on the first threshold value and the second threshold value, the first state is a state in which the charged particles are not detected, the second state is a state in which one charged particle is detected, and the third state is a state in which two or more charged particles are detected. In this case, the first threshold is a value corresponding to one charged particle and the second threshold is an arbitrary value corresponding to two or more charged particles.

The determination unit may perform second determination of dividing the detection information into the first state and the second state based on the first threshold value. The information processing device may have a GUI for displaying the measured image of the sample based on the first determination and the measured image of the sample based on the second determination. Therefore, the determination unit may execute a plurality of determining processes by a plurality of threshold values and display the respective measured images of the sample in the plurality of states obtained by the plurality of determining processes on the GUI.

It should be noted that the first threshold value and the second threshold value may be determined according to the type (secondary electrons, reflected electrons, scattered electrons, etc.) of charged particles to be detected. The determination is preferable when the energy of the discharged charged particles is different depending on the type of charged particles. The first threshold value and the second threshold value may be determined according to the type of the sample. For example, in the case where the sample is a wafer, the first threshold value and the second threshold value may be determined according to the material of the wafer.

Second Embodiment

In the present embodiment, an example in which a charged particle detection device is applied to a charged particle beam apparatus will be described. The charged particle beam apparatus scans a surface of a sample with a primary charged particle beam (for example, electrons) and detects charged particles secondarily generated from the sample, thereby acquiring, analyzing, and processing the observed image of the sample. As a typical example of the charged particle beam apparatus, there is a scanning electron microscope (SEM). An example in which the present invention is applied to a scanning electron microscope (SEM) will be described below. The present invention can also be applied to another charged particle beam apparatus (scanning transmission electron microscope, helium ion microscope, and so on). In other words, the present invention is applicable to all charged particle beam apparatuses.

Figure 8:
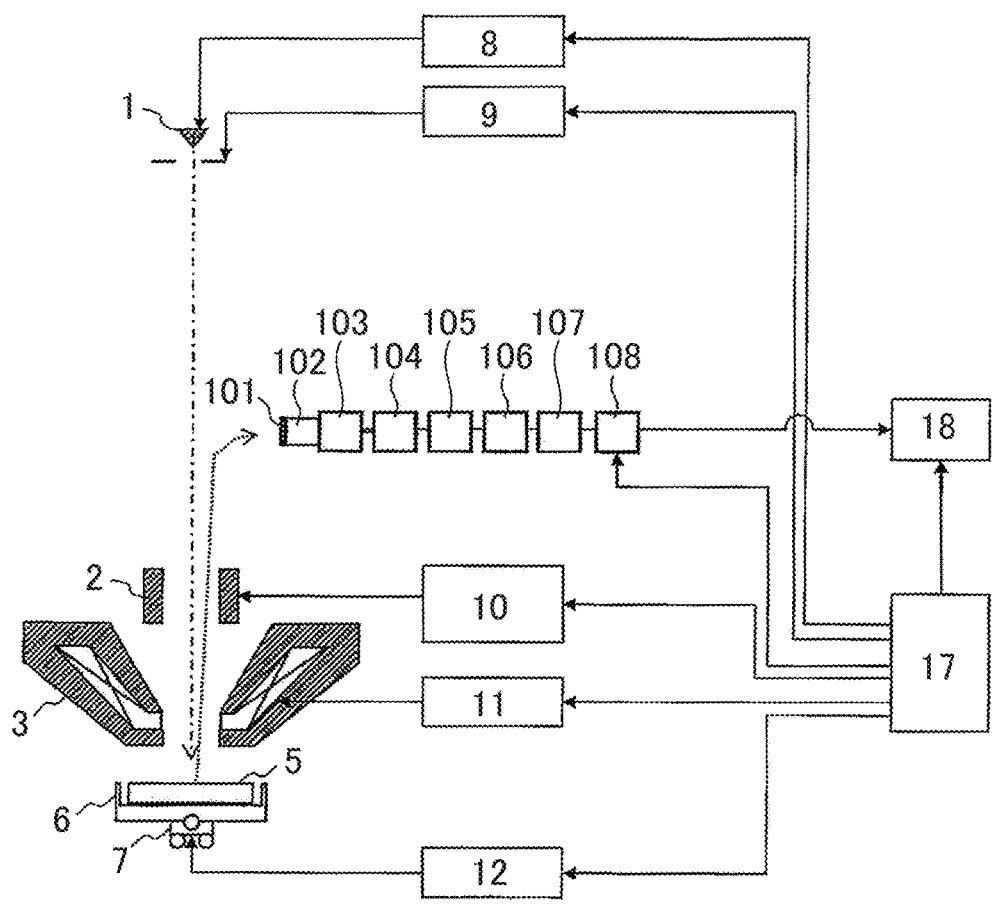
FIG. 8 is a configuration diagram illustrating an example of a charged particle beam apparatus according to a second embodiment.

Hereinafter, a method of measuring emitted electrons and a method of acquiring an image in the scanning electron microscope (SEM) will be described. FIG. 8 illustrates a configuration example of a scanning electron microscope according to the present embodiment. The scanning electron microscope includes an electron optical system, a stage mechanical system, an SEM control system, and an SEM operation system.

The electron optical system includes an electron gun 1, a deflector 2, an objective lens 3, and charged particle detection devices (101, 102, 103, 104, 105, 106, 107, and 108) illustrated in FIG. 1. Incidentally, the electron optical system of the scanning electron microscope may include other lenses, electrodes, and detectors in addition to the above, or may be partially different from the above, and the configuration of the electron beam optical system is limited to that configuration.

The stage mechanism system includes a sample holder 6 for installing a sample 5 and a stage 7 that is tilt-controllable and movable in X, Y, and Z axis directions.

The SEM control system includes an acceleration voltage control unit 8 that controls an acceleration voltage of the electron gun 1, a current control unit 9 that controls a current of primary electrons, a deflection scanning signal control unit 10 that controls the deflector 2, an objective lens coil control unit 11 that controls the objective lens 3, and a stage control unit 12 that can apply a retarding voltage to the stage 7.

The SEM operation system includes a measurement result display unit 18 and an operation interface 17. The measurement result display unit 18 includes a display that displays an image generated by the measurement in the charged particle detection devices (101, 102, 103, 104, 105, 106, 107, and 108) and so on. The operation interface 17 is an interface that operates the various control units (8, 9, 10, 11, 12), the arithmetic processing unit 108, and a measurement result display unit 18. Observation conditions can be set with the use of the operation interface 17.

In the present embodiment, in order to measure the emitted electron current with high accuracy, a plurality of trigger signals as a reference of time are generated by the operation interface 17 and deflection control of an electron beam and a detection control system are synchronized with each other, to thereby acquire an SEM image high in CNR.

In the present embodiment, in a scanning clock of the primary electron beam in the SEM, the deflection scanning signal control unit 10 controls polarization scanning in an X direction so that a time (pixel time) during which the primary electrons stay in one pixel is 100 ns. Irradiation energy of the primary electrons is not particularly limited, but preferably 200 eV to 400 eV with a maximum emission rate, in this example, 300 eV.

A current of the primary electrons is set to 5 pA as in the first embodiment. A photon quantity of the scintillator 101 depends on the number of incident electrons and energy. In this example, because a voltage of 10 kV is applied to the scintillator 101 (not shown), the emitted electron energy is 10 kV plus secondary electron energy (10 kV+0.05 kV) in the case of secondary electrons (energy<50 eV). In addition, in the case of backscattered electrons, the emitted electron energy is 10 kV plus incident electron energy (10 kV+0.3 kV). Therefore, the photon amount from the scintillator 101 can obtain only a difference of about 10% to 20%. In other words, the amount of photons generated by the scintillator 101 mainly reflects the number of electrons.

As described in the first embodiment, an average interval of one event is 32 ns, and 3 to 4 events occur within one pixel time. The charged particle detection device synchronizes with a deflection scan signal and counts on a three-event basis.

Incidentally, the problem relating to the present embodiment is highly accurate measurement of emitted electrons. In the first embodiment, a method of removing the photon amount variation of the scintillator 101 and the dark current noise of the photomultiplier tube by the digital processing was described. However, in order to reduce shot noise caused by fluctuation attributable to the primary electrons having a Poisson distribution, a constant signal integration is necessary. Because the variation due to the shot noise depends on a square root of the signal amount from the sample, a required number of integration depends on the emission rate of the sample.

In the present embodiment, a shot noise is reduced with the use of the irradiation energy condition for increasing the secondary electron emission rate and with the counting arithmetic processing or a frame integration to be described in the following third embodiment.

Third Embodiment

In the present embodiment, in the charged particle detection device according to the first embodiment and the charged particle beam apparatus according to the second embodiment, a method of counting and calculating emitted electrons and a method of acquiring an image will be described.

In this example, as in the first embodiment and the second embodiment, a primary electron current is set to 5 pA, and a pixel time is set to 100 ns. In addition, a count value of an event I of pixel coordinates (l, m) of a k-th frame image is set to $N^k_{l,m,i}$, a pixel signal value is $Z^k_{l,m}$, and a pixel signal of the SEM image is $Z_{l,m}$.

First Example of Signal Arithmetic Processing

A first example of the signal arithmetic processing for conversion to an image signal after counting the emitted electrons is the simplest method, which is a method of outputting an integrated value of the count value in the event in each pixel. An arithmetic processing unit 108 outputs an integrated value of the multilevel count value at each pixel of a sample image as a pixel signal. In other words, the pixel signal $Z_{1,m}$ of the SEM image is expressed as follows.

[Ex. 5]

$$Z_{l,m} = \Sigma_k \Sigma_{i=1}^{3} N_{l,m,i}^{k} \quad (5)$$

The frame integration number (the maximum value of k) depends on the required CNR and the emission rate of the sample. If an image is formed in that method, an image with CNR similar to analog method of 50% or more can be obtained.

Second Example of Signal Arithmetic Process

A second example of the signal arithmetic processing method is a method of performing discrimination by adding a threshold value to a count value N in an event in each pixel. If the arithmetic processing unit 108 discriminates between a first set in which the multilevel count value N is smaller than a predetermined threshold value and a second set in which the multilevel count value N is equal to or larger than a predetermined threshold value, and outputs each of an integrated value of the first set and an integrated value of the second set as a pixel signal. For example, there is a method of discriminating between a group A of N=0 or N=1 and a group B in which N is 2 or more. Reference numerals 114 and 115 of FIG. 3 indicate the results of dividing data of the multilevel count value into two groups with the use of a threshold value. In this example, reference numeral 115 in FIG. 3 corresponds to the group A, and 114 in FIG. 3 corresponds to the group B.

The event of the group B is mainly a secondary electron emission process. The group A is mainly a reflected electron emission process. In an edge portion of the sample, because the secondary electron process increases, in the image using the group of N=2 or more, an image in which a contour line of the sample is emphasized is obtained. Note that a threshold value of N>2 may be provided for the group B. In this case, a sharper contour line extracted image can be obtained.

Further, in the image using the group A signals of N=0 or N=1, an image in which a composition difference of the sample is emphasized can be obtained. In the known method, energy discrimination of emitted electrons by the electron optical system is performed, and in order to obtain the secondary electron image and the backscattered electron image, there is a need to acquire the image twice. In the present embodiment, although the reflected electron component and the secondary electron component are not strictly discriminated, an image (pseudo secondary electron image) corresponding to a secondary electron image and an image (pseudo reflected electron image) corresponding to a backscattered electron image can be acquired by one image acquisition.

The signals of each group discriminated by the present method are integrated by Expression (5) and imaged. Each image can be output individually, or can be color-coded with one image and output.

In this example, the example in which the threshold value N=2 is used for discrimination into two groups is described, but the present invention is not limited to this example. For example, based on the unit peak value and the threshold value N=2, the multilevel count value N may be divided into a first state, a second state, and a third state. As an example, the first state is a state of N=0 (a state where no electrons are detected), and the second state is a state of N=1 (a state in which one electron is detected), and the third state is a state in which N is equal to or greater than 2 (a state in which two or more electrons are detected). Further, the multilevel count value N may be divided into a plurality of states with the use of two or more threshold values.

Figure 9:
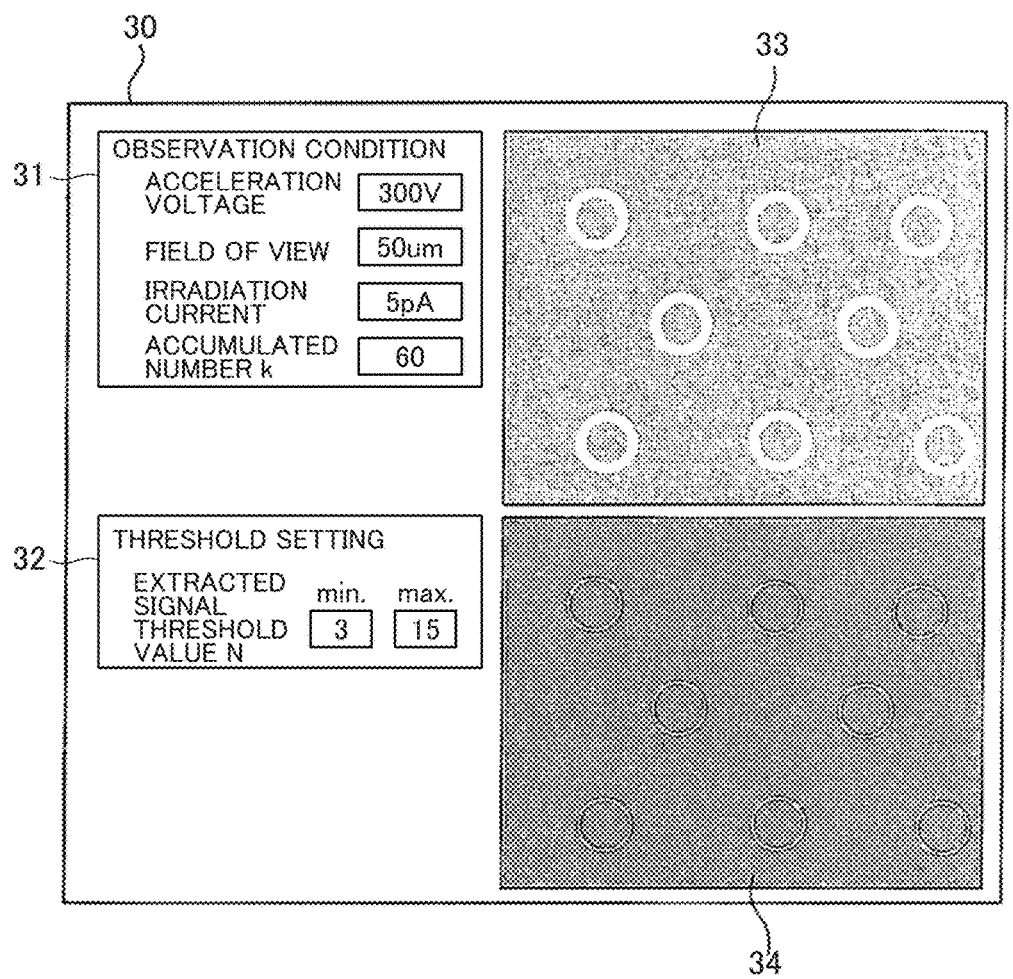
FIG. 9 is a diagram illustrating one example of a GUI in a measurement result display unit.

FIG. 9 illustrates an example of the GUI in the measurement result display unit 18, which shows the result of image acquisition when discriminating data of the multilevel count value output from the electronic counter 107 with the use of a threshold value. In this example, the arithmetic processing unit 108 outputs the integrated value of the multilevel count value equal to or larger than the threshold value as the pixel signal with reference to a predetermined threshold value. The GUI 30 includes an SEM observation condition setting unit 31, a signal threshold setting unit 32, an SEM image display unit 33, and a threshold image display unit 34.

Various observation conditions such as acceleration voltage can be set in the SEM observation condition setting section 31. A lower limit and an upper limit of the threshold can be set in the signal threshold setting section 32. A normal SEM image (an image as a result of executing a binary counting process) is displayed on the SEM image display unit 33. An image obtained by extracting the signal in a range (a range of the threshold value is 3 to 15) set in the signal threshold setting unit 32 from the multilevel count value is displayed on the threshold image display unit 34. According to this configuration, an ordinary SEM image and an image that has been subjected to threshold processing can be displayed in a side-by-side manner. For example, the threshold image display unit 34 may be configured so as to switchingly display the images of the group A and the group B described above.

In the example of FIG. 9, the arithmetic unit executes the multilevel counting process as a first determination process, and sorts the multilevel count value N in a first state ($0 \le N < 3$), a second state ($3 \le N \le 15$), and a third state ($15 < N$). Further, as a second determination process, the calculation unit performs processing for acquiring the normal SEM image (in other words, a binary counting process of discriminating a state where no electrons are detected and a state where the electrons are detected). In the example of FIG. 9, the arithmetic unit displays the normal SEM image (measured image) and the SEM image (measured image) of the second state ($3 \le N \le 15$) on the GUI. A lower limit and an upper limit of the threshold value can be appropriately changed on the screen. Hence, the image to be displayed on the GUI may be appropriately changed.

Also, the present invention is not limited to the example of FIG. 9, and the arithmetic unit may select all or arbitrary multiple states of the first state, the second state, and the third state discriminated with the use of the multiple threshold values, and the plurality of images may be displayed on the GUI. In other words, the arithmetic unit may execute a plurality of determination processes based on a plurality of thresholds, and an arbitrary state may be selected from a plurality of states divided by the plurality of determination processes and displayed on the GUI.

Third Example of Signal Arithmetic Processing

In a third example of the signal arithmetic method, the arithmetic processing unit 108 executes predetermined statistical processing on the multilevel count value of each pixel and outputs the result of the statistical processing. For example, the arithmetic processing unit 108 outputs the histogram of $N^k_{l, m, i}$, and calculates an average value and a dispersion from the event value (multivalued count value) in each pixel. As already described above, FIG. 4 illustrates an example of outputting the histogram, the average value, and the dispersion. It is conceivable that the histogram, the mean, the variance, and the like are changed according to the sample to be observed, and the result of such statistical processing can be used for signal processing.

As described above, the primary electrons and the backscattered electrons have a Poisson distribution, but secondary electrons have a Poisson distribution or a normal distribution. When an image is to be acquired without irradiating the sample with the electron beams more than necessary, in order to compensate for a decrease in the CNR due to a signal amount shortage, a statistical model can be created and an image can be generated from the estimated count value of each pixel. The statistical model is created in advance by performing the measurement where the outside of the observation area is irradiated with a sufficient electron beam, and stored in a storage device not shown. For example, the histogram information described above may be used to create a statistical model in this case. The arithmetic processing unit 108 calculates an estimated count value of each pixel with the use of a statistical model created in advance and outputs the estimated count value as a pixel signal. This makes it possible to create an image from the estimated count value.

Fourth Example of Signal Arithmetic Processing

A fourth example of the signal arithmetic processing method is a method of performing arithmetic processing with the use of a count value of a part of events of adjacent pixels. The arithmetic processing unit 108 outputs the integrated value including a part of the adjacent pixels with respect to each pixel of the sample image as a pixel signal. The method is particularly effective when an observation magnification is increased and a pixel size becomes smaller than an in-sample spread of the primary electrons (for example, in the case of observation at 200,000 times, the pixel size is about 0.6 nm). In the case of adjacent pixels in the x direction, the pixel signal can be expressed by the following Expression.

[Ex. 6]

$$Z_{l,m} = \Sigma_k \Sigma_{i=1}^3 (N_{l,m,i}^k + N_{l-1,m,3}^k + N_{l+1,m,1}^k) \quad (6)$$

The meaning of Expression (6) is that in a coordinates (l, m) pixel, the signal processing of the first example or the second example described above is performed as five events with the use of a third event value of a ((l−1), m) pixel and a first event count value of a ((l+1), m)-th pixel.

If the CNR of the normal SEM image is sufficient (3 to 5), a frame integration number is set to 60%. As a result, the primary electron beam irradiation dose can be reduced. Further, if the CNR of the normal SEM image is lower than 3, the CNR improves without increasing the number of frames (without increasing the irradiation amount of the primary electron beam).

Figure 10:
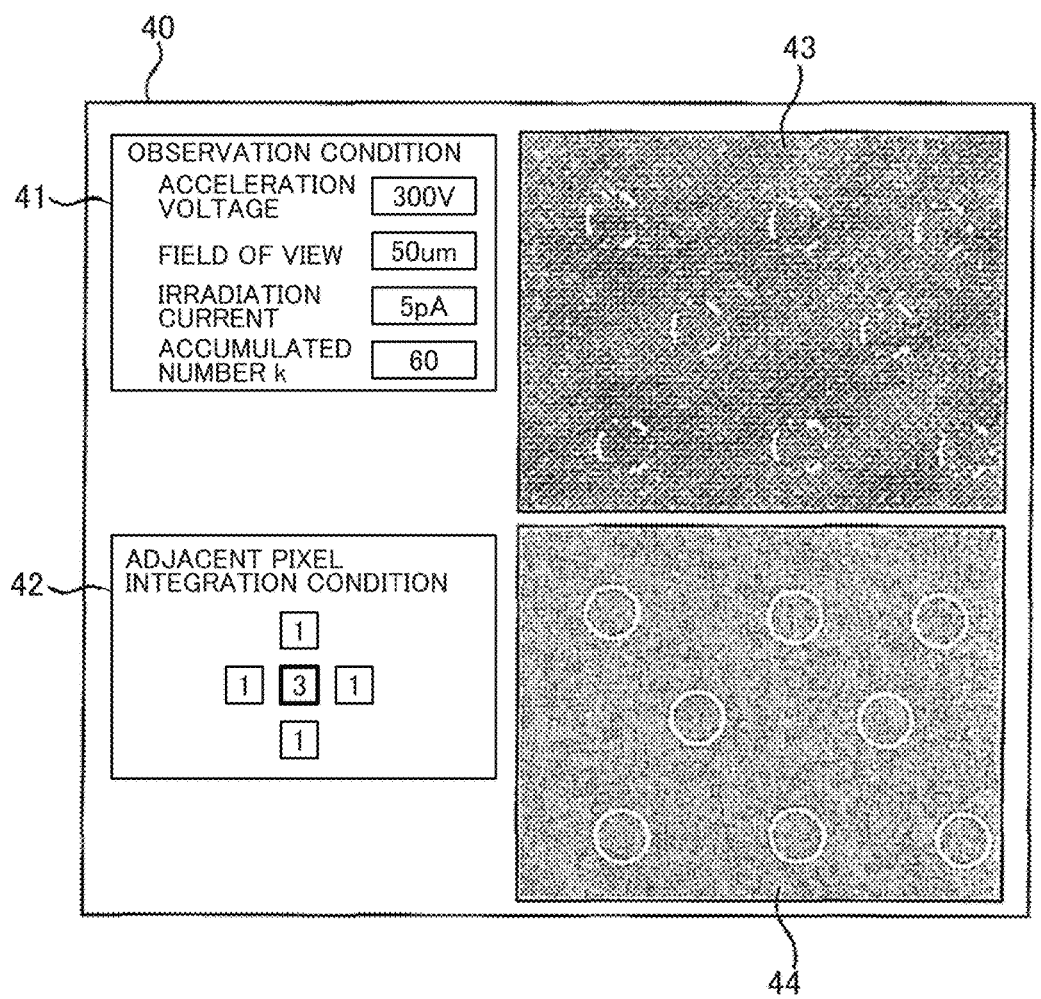
FIG. 10 is a diagram illustrating another example of the GUI in the measurement result display unit.

FIG. 10 illustrates an example of the GUI in the measurement result display unit 18, which illustrates the image acquisition result when the integration processing with the adjacent pixels is executed. The GUI 40 includes a SEM observation condition input unit 41, a pixel integration condition input unit 42, an SEM image display unit 43, and a pixel integration processing image display unit 44.

In the SEM observation condition input unit 41, various observation conditions such as an acceleration voltage can be set. In the pixel integration condition input unit 42, the integration conditions with the nearest pixels of up, down, right and left can be set. The setting conditions in the pixel integration condition input unit 42 of FIG. 10 means that the integration processing for seven events is executed with the use of the signal of an arbitrary one event of each of the vertically and horizontally nearest pixels centered on a target pixel, and the signals of three events of the target pixel, to thereby provide the integral value in the target pixel. A normal SEM image (an image without integration processing with adjacent pixels) is displayed on the SEM image display section 43. In the pixel integration processing image display unit 44, the SEM image integrated under the conditions set by the pixel integration condition input unit 42 is displayed.

According to the present embodiment, in the measuring method with the charged particle detection device or the charged particle beam, apparatus, the signals can be detected with higher accuracy while reducing influence of noise which becomes a problem in a minute detection signal. Also, the charged particle detection device or the charged particle beam apparatus with a high SN ratio while suppressing the voltage fluctuation of the detector can be provided.

Fourth Embodiment

If suitable low irradiation energy with a high secondary electron emission rate is used, a sample may be positively charged and an image damage may occur in the observation of an insulator or a high resistance sample. Therefore, in the present embodiment, in order to eliminate the influence of sample charging, an example will be described in which the charged particle detection device according to the first embodiment is applied to a scanning electron microscope in which irradiation timing and detection timing are synchronized with a control system capable of blocking a primary electron beam.

Figure 11:
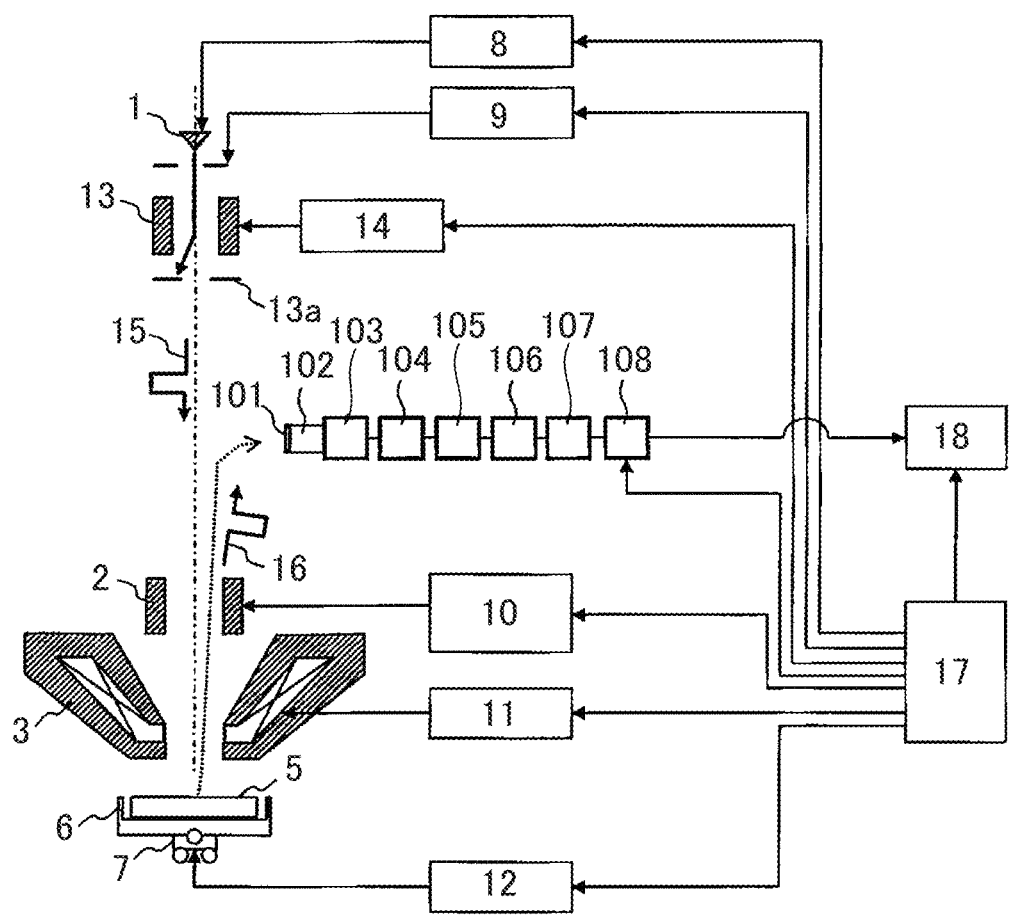
FIG. 11 is a configuration diagram illustrating an example of a charged particle beam apparatus according to a fourth embodiment.

FIG. 11 is a configuration diagram illustrating an example of a charged particle beam apparatus according to the fourth embodiment. Referring to FIG. 11, the same components as those in FIG. 8 are denoted by identical reference numerals, and repeated description will be omitted.

In an electron optical system according to the present embodiment, a blanker 13 and a blanker aperture 13a are additionally provided to the configuration of FIG. 8. Also, in the SEM control system, a blanker control unit 14 that controls the blanker 13 is added to the configuration of FIG. 8.

In the present embodiment, in order to measure the emitted electron current with high accuracy, a plurality of trigger signals serving as a time reference are generated by the operation interface 17, the electron beam is pulsed by the blanker control unit 14, and a deflection control system of the irradiation pulse electron beam 15 is synchronized with the detection control system of the emitted pulse electrons 16. With the programming of the generation of the trigger signals from the operation interface 17, an image can be formed by irradiating an arbitrary pixel with an electron beam.

For example, an image irradiated with the electron beam at random can be obtained, or pixel data thinned out at fixed intervals in the X and Y directions can be acquired, and the pixel data thinned out in the subsequent frames can be acquired. Because those methods are unlikely to be affected by the sample charging as compared with a normal TV scanning method, the SEM image free from image disturbance due to charging can be acquired.

In the present embodiment, a deflection scanning signal control unit 10 is set so that a scanning clock of a primary electron beam of the SEM is kept constant, and a time (pixel time) during which the primary electrons stay in one pixel is set to 100 ns. The irradiation energy of electrons is not particularly limited, but the irradiation energy is preferably 200 eV to 400 eV having a maximum emission rate, and is 300 eV in this example. The current of the primary electrons is set to 5 pA as in the first embodiment.

In this example, since a voltage of 10 kV is applied to the scintillator 101, most of the energy of emitted electrons is 10 kV plus secondary electron energy (10 kV+0.05 kV) in the case of secondary electrons (energy<50 eV) KV). In the case of backscattered electrons, the emitted electron energy is 10 kV plus incident electron energy (10 kV+0.3 kV). Therefore, the pulse wave height output can only obtain a difference of about 10% to 20%.

As described in the first embodiment, the average interval of one event is 32 ns, and is 3 to 4 events per pixel. The charged particle detection device synchronizes with a deflection scanning signal, and performs counting on a three-event basis. The output signal of one pixel is obtained by the various signal arithmetic processing described in the third embodiment. Image formation is performed by acquiring a plurality of frames by the irradiation pulse electron beam 15.

In the observation of the insulator or the high resistance sample, the sample is charged positively and image disturbance may occur. According to the present embodiment, the electron beam is blocked by the blanker 13 and the blanker aperture 13a, and the sample is irradiated with the pulse electrons. In addition, the deflection control system of the irradiation pulse electron beam 15 and the detection control system of the emission pulse electrons 16 are synchronized with each other. As a result, the influence of sample charging can be eliminated.

The respective embodiments of the present invention have been described above. However, the present invention includes various modified examples without departing from the subject matter of the present invention. For example, in the abovementioned embodiments, in order to easily understand the present invention, the specific configurations are described. However, the present invention does not always provide all of the configurations described above. Also, a part of one configuration example can be replaced with another configuration example, and the configuration of one embodiment can be added with the configuration of another embodiment. Also, in a part of the respective configuration examples, another configuration can be added, deleted, or replaced.

The counting process and the signal arithmetic processing described above can also be realized by a program code of software which realizes the functions of the embodiment. In this case, a system or an apparatus is supplied with a storage medium in which the program code is recorded, and a computer (or a CPU or an MPU) of the system or the apparatus reads the program code stored in the storage medium. In this case, the program, code itself read from the storage medium realizes the functions of the above described embodiment, and hence the program code itself and the storage medium in which the program code is stored constitute the present invention. As the storage medium for supplying such a program code, for example, a flexible disk, a CD-ROM, a DVD-ROM, a hard disk, an optical disk, a magnetic-optical disk, a CD-R, a magnetic tape, a nonvolatile memory card, a ROM or the like is used.

The processes and techniques described herein are not inherently related to any particular device but can be implemented by any suitable combination of components. Furthermore, various types of devices for general purposes can be used. In some cases, it may be beneficial to build a dedicated device to perform the steps of the method described above. That is, part or all of the above-described counting processing and signal arithmetic processing may be realized by hardware using electronic components such as integrated circuits.

Further, in the embodiments described above, control lines and information lines shown are considered to be necessary for description. All control lines and information lines are not necessarily required for products. It may be considered that all constituent elements are interconnected actually.

LIST OF REFERENCE SIGNS

1: electron gun
2: deflector
3: objective lens
5: sample
6: sample holder
7: stage
8: acceleration voltage control unit
9: primary electron current control unit
10: deflection scanning signal control unit
11: objective lens coil control unit
12: stage control unit
13: Blanker
13a: Blanker aperture
14: Blanker control unit
15: irradiation pulse electron beam
16: emitted pulse electron
17: operation interface
18: measurement result display unit
20: GUI
21: measurement condition input unit
22: acceleration voltage setting unit
23: primary electron current setting unit
24: sample holder applied voltage setting unit
27: time series measurement data display unit
28: first statistical processing result display unit (histogram of emitted electron number)
29: second statistical processing result display unit (average value and dispersion)
30: GUI
31: SEM observation condition setting unit
32: signal threshold setting unit
33: SEM image display unit
34: threshold image display unit
40: GUI
41: SEM observation condition input unit
42: pixel integration condition input unit
43: SEM image display unit
44: pixel integration processing image display unit
101: scintillator
102: light guide
103: photomultiplier tube
104: analog amplifier
105: analogue-to-digital converter
106: wave height discrimination unit
107: electronic counter
108: arithmetic processing unit
110: analog pulse signal
111: digital signal
112: wave height measurement result
113: count result
114: signal processing result
115: signal processing result
120: flat portion
121: analog signal of flat portion
122: binary value counting result of flat portion
123: multilevel counting result of flat portion
130: edge portion
131: analog signal of edge portion
132: binary counting result of edge portion
133: multilevel count result of edge portion

The invention claimed is:

1. A charged particle beam apparatus comprising:
a stage on which a sample is placed;
a charged particle beam optical system that irradiates the sample with a charged particle beam; and
a charged particle detection device that detects charged particles secondarily generated from the sample,
wherein the charged particle detection device includes:
a photoelectric conversion unit that converts the charged particles from the sample into photons and converts the photons into an analog electric signal,
an analog-to-digital conversion unit that converts the analog electrical signal into a digital signal, and
an arithmetic unit that counts the digital signal,
wherein the arithmetic unit determines a plurality of values of a signal per unit time in the digital signal with use of a unit peak value related to one event generated when the sample is irradiated with one charged particle and outputs a multilevel count value based on the plurality of values of the signal per unit time.

2. The charged particle beam apparatus according to claim 1,
wherein the arithmetic unit outputs an integrated value of the multilevel count values in each pixel of a sample image as a pixel signal.

3. The charged particle beam apparatus according to claim 1,
wherein the arithmetic unit discriminates between a first group in which the multilevel count value is smaller than a predetermined threshold value and a second group in which the multilevel count value is equal to or larger than the predetermined threshold value, and outputs an accumulated value of the first group and an integrated value of the second group as a pixel signal.

4. The charged particle beam apparatus according to claim 1,
wherein the arithmetic unit executes a predetermined statistical process on the multilevel count value and outputs a result of the statistical process.

5. The charged particle beam apparatus according to claim 4,
wherein the result of the statistical process includes at least one of a histogram, an average, and a dispersion of the multilevel count value.

6. The charged particle beam apparatus according to claim 1,
wherein the arithmetic unit outputs an estimated count value in each pixel of a sample image as a pixel signal with the use of a statistical model created in advance.

7. The charged particle beam apparatus according to claim 1,
wherein the arithmetic unit outputs an integrated value including a part of adjacent pixels for each pixel of a sample image as a pixel signal.

8. The charged particle beam apparatus according to claim 1,
wherein when it is assumed that a current of the charged particle beam is I and an elemental charge is e, a frequency band f of an analog amplification in the photoelectric conversion unit is equal to or larger than 10× I/e, and a sampling frequency $f_2$ of the analog-to-digital conversion unit is equal to or larger than $2 \times f_1$.

9. The charged particle beam apparatus according to claim 1,
wherein the charged particle beam optical system blocks the charged particle beam and irradiates the sample with pulsed charged particles, and
deflection control of the pulsed charged particles in the charged particle beam optical system and detection control of the emitted pulsed charged particles from the sample in the charged particle detection device are synchronized with each other.

10. The charged particle beam apparatus according to claim 1,
wherein the charged particle beam apparatus is a scanning electron microscope.

11. An information processing apparatus comprising:
an input unit that inputs detection information obtained by detecting charged particles caused by a sample irradiated with a charged particle beam as a current value or a voltage value; and
a determination unit that makes a first determination of dividing the detection information into a first state, a second state, and a third state based on arbitrary first and second threshold values determined by a current value or a voltage value.

12. The information processing apparatus according to claim 11,
wherein the first state is a state in which the charged particles are not detected,
the second state is a state in which one of the charged particles is detected, and
the third state is a state in which two or more of the charged particles are detected.

13. The information processing apparatus according to claim 11,
wherein the charged particles are electrons measured by a scanning electron microscope.

14. The information processing apparatus according to claim 11,
wherein the second threshold value is determined according to a type of the sample or a type of the charged particles.

15. The information processing apparatus according to claim 11,
wherein the determination unit makes second determination of dividing the detection information into the first state and the second state based on the first threshold value, and
the information processing apparatus further includes a GUI that displays a measurement image of the sample based on the first determination and a measurement image of the sample based on the second determination.

* * * * *